US005543260A

United States Patent [19]

Tateishi et al.

[11] Patent Number: 5,543,260

[45] Date of Patent: Aug. 6, 1996

[54] DIAZO HEAT-SENSITIVE RECORDING MATERIAL

[75] Inventors: Keiichi Tateishi; Sadao Ishige; Hiroshi Kamikawa, all of Shizuoka, Japan

[73] Assignee: Fuji Photo Film Co., Ltd., Kanagawa, Japan

[21] Appl. No.: 337,470

[22] Filed: Nov. 8, 1994

[30] Foreign Application Priority Data

Nov. 8, 1993 [JP] Japan .................................... 5-278608

[51] Int. Cl.$^6$ .............................. G03F 7/021; G03C 1/58

[52] U.S. Cl. .......................... 430/138; 430/151; 430/157; 430/176; 430/179; 430/185

[58] Field of Search .................................... 430/138, 151, 430/157, 176, 179, 185

[56] References Cited

U.S. PATENT DOCUMENTS 5,213,939 5/1993 Sugiyama ................................ 430/138

FOREIGN PATENT DOCUMENTS 254250 2/1990 Japan .

4135787 5/1992 Japan .

*Primary Examiner*—Charles L. Bowers, Jr.

*Assistant Examiner*—Christopher G. Young

*Attorney, Agent, or Firm*—Sughrue, Mion, Zinn, Macpeak & Seas

[57] ABSTRACT

A diazo heat-sensitive recording material containing a support having provided thereon a recording layer containing a diazo compound, a coupler, and an organic base, wherein the diazo compound is a compound represented by formula (I):

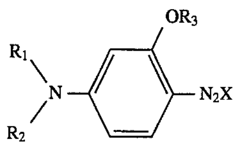

(I)

wherein $R_1$ represents $—C(Z_1)(Z_2)—CH_2—A$, $—CH_2—C(Z_1)(Z_2)—A$ or $—\{C(Z_1)(Z_2)\}_m—A$, wherein $Z_1$ represents an alkyl group, an aralkyl group or an aryl group; $Z_2$ represents a hydrogen atom, an alkyl group, an aralkyl group or an aryl group; A represents a halogen atom, an acyl group, a cyano group, or a group containing at least one oxygen, nitrogen, phosphorus or sulfur atom through which A is bonded to $—CH_2—$ or $Z_2$; and m represents an integer of 1 to 5; $R_2$ and $R_3$, which may be the same or different, each represent an alkyl group, an aralkyl group or an aryl group; $R_1$ and $R_2$ may be connected together via A to form a ring; and X represents an acid anion, and the coupler is a compound having at least 20 carbon atoms in total, represented by formula (II):

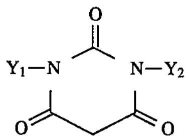

(II)

wherein $Y_1$ and $Y_2$, which may be the same or different, each represent a hydrogen atom, an alkyl group, an aralkyl group, or an aryl group. The diazo heat-sensitive recording material of the present invention exhibits excellent raw stock aging stability before recording and excellent image stability, especially light fastness, after recording.

6 Claims, No Drawings

DIAZO HEAT-SENSITIVE RECORDING MATERIAL

FIELD OF THE INVENTION

This invention relates to a diazo heat-sensitive recording material utilizing the light-sensitivity of a diazo compound (a diazonium salt) and, more particularly to a red color-forming diazo heat-sensitive material which is particularly excellent in storage stability (light fastness) of the color developed area.

BACKGROUND OF THE INVENTION

A diazonium salt has high chemical activity and is readily able to react with a phenol derivative or a compound having an active methylene group, called a coupler, to form an azo dye. The diazonium salt is also light-sensitive and, as a result, decomposes on exposure to light to lose its reactivity with coupler. Due to such properties, a diazonium salt has long been used in light-sensitive recording media exemplified by diazo type paper (see Nihon Shashin Gakkai (ed.), *Shashin Kogaku no Kiso "Higin-en Shashin hen"*, pp. 89–117 and 182–201, Corona K. K. (1982)). In recent years, the ability of the diazonium salt to decompose on exposure to light and lose its activity has been utilized in recording materials which fix an image. For example, a light-fixable heat-sensitive recording material has been proposed, in which a diazonium salt and a coupler are thermally reacted to form an image, which can be fixed by exposure to light (see Koji Sato, et al., *Gazo Denshi Gakkaishi,* Vol. 11, No. 4, pp. 290–296 (1982)). However, these recording media using a diazonium salt as a coloring factor are disadvantageous in that the diazonium salt gradually undergoes thermal decomposition even in a dark place due to its high activity. As a result the shelf life of these recording materials is short.

Various approaches have been proposed to overcome the instability of the diazonium salt. One of the most effective means is to microencapsulate the diazonium compound. A microencapsulated diazonium compound is isolated from the factors which may accelerate decomposition of the diazonium compound, such as water and a base, and remarkably suppresses the decomposition, thereby providing a recording material having a prolonged shelf life (see Tomomasa Usami, et al., *Shashin Gakkaishi,* Vol. 26, No. 2, pp. 115–125 (1987).

A diazonium salt is generally microencapsulated by a process comprising dissolving a diazonium salt in a hydrophobic solvent to form an oily phase, emulsifying the oily phase in an aqueous solution of a water-soluble high polymer (aqueous phase) by means of a homogenizer, etc. in the presence of a microcapsule wall-forming monomer or prepolymer added to either one or both of the oily phase and the aqueous phase, whereby a polymerization reaction takes place or a polymer is precipitated on the interface between the oily phase and the aqueous phase to form a polymeric microcapsule wall. For greater detail, refer to such literature as Choshi Kondo, *Microcapsule,* The Nikken Kogyo Shimbun Ltd. (1970) and Tamotsu Kondo, et al., *Microcapsule,* Sankyo Shuppan K. K. (1977). The thus formed microcapsule wall comprises crosslinked gelatin, alginates, cellulose derivatives, urea resins, urethane resins, melamine resins, nylon resins, etc. Of these microcapsule wall materials, those having a glass transition temperature slightly higher than room temperature, such as urea resins or urethane resins, have non-permeability at room temperature and turn permeable at temperatures higher than the glass transition temperature. Microcapsules having such a microcapsule wall, called heat-sensitive wall microcapsules, are useful for heat-sensitive recording materials. That is, a recording material comprising a support coated with heat-sensitive wall microcapsules containing a diazonium salt, a coupler, and a base retains the diazonium salt in a stable state for an extended period of time and easily develops a color image on heating, which color image can be fixed by exposure to light.

Aside from improving stability of a diazonium compound by microencapsulation, the inventors studied ways to obtain improvements in aging stability and oil-solubility of a diazonium compound and found that a 4-substituted amino-2-alkoxybenzenediazonium salt exhibits excellent performance properties as disclosed in JP-A-4-59288 (the term "JP-A", as used herein, means an unexamined published Japanese patent application). As a result of further studies using a combination of this specific diazonium compound with a coupler, the present inventors found that a combination using a barbituric acid derivative as the coupler develops a red dye having a satisfactory hue as disclosed in JP-A-4-197782. However, a recording material containing the 4-substituted amino-2-alkoxybenzenediazonium salt is still unsatisfactory in both raw stock aging stability (resistance to coloring of the background before recording) and record stability (light fastness of the color image). In order to solve these problems, the present inventors have conducted extensive investigations and, as a result, found that a combination of a diazo compound having a specific substituent and a barbituric acid derivative (as the coupler) having a specific substituent as a coupler exhibits excellent performance properties. The present invention has been completed based on this finding.

SUMMARY OF THE INVENTION

An object of the present invention is to provide a diazo heat-sensitive recording material having excellent raw stock aging stability before recording and excellent image stability, especially light fastness, after recording.

This object of the present invention is accomplished by a diazo heat-sensitive recording material comprising a support having provided thereon a recording layer containing a diazo compound, a coupler, and an organic base, in which the diazo compound is a compound represented by formula (I):

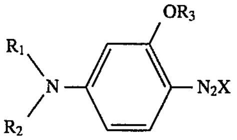

(I)

wherein $R_1$ represents $—C(Z_1)(Z_2)—CH_2—A$, $—CH_2—C(Z_1)(Z_2)—A$ or $—\{C(Z_1)(Z_2)\}_m—A$, wherein $Z_1$ represents a substituted or unsubstituted alkyl group, a substituted or unsubstituted aralkyl group or a substituted or unsubstituted aryl group; $Z_2$ represents a hydrogen atom, a substituted or unsubstituted alkyl group, a substituted or unsubstituted aralkyl group or a substituted or unsubstituted aryl group; A represents a halogen atom, an acyl group, a cyano group, or a group containing at least one oxygen, nitrogen, phosphorus or sulfur atom through which A is bonded to $—CH_2—$ or $Z_2$; and m represents an integer of 1 to 5;

$R_2$ and $R_3$, which may be the same or different, each represents a substituted or unsubstituted alkyl group, a substituted or unsubstituted aralkyl group or a substituted or unsubstituted aryl group; $R_1$ and $R_2$ may be connected together via A to form a ring; and X represents an acid anion, and the coupler is a compound having at least 20 carbon atoms in total, represented by formula (II):

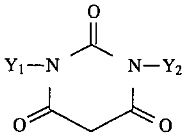

(II)

wherein $Y_1$ and $Y_2$, which may be the same or different, each represents a hydrogen atom, a substituted or unsubstituted alkyl group, a substituted or unsubstituted aralkyl group, or a substituted or unsubstituted aryl group.

If the present diazo compound is used with a coupler outside the scope of the present coupler, the objects of the present invention are not achieved.

DETAILED DESCRIPTION OF THE INVENTION

In formula (I), $R_1$ preferably represents $-C(Z_1)(Z_2)-CH_2-O-Z_3$, $-CH_2-C(Z_1)(Z_2)-O-Z_3$ or $-\{C(Z_1)(Z_2)\}_m-O-Z_3$, more preferably $-CH(Z_1)-CH_2O-Z_3$, $-CH(Z_1)-CH(Z_1)-O-Z_3$, or $-CH_2-CH(Z_1)-O-Z_3$, and most preferably $-CH(Z_1)CH_2O-Z_3$ or $-CH_2-CH(Z_1)-O-Z_3$, wherein $Z_1$ represents a substituted or unsubstituted alkyl group, a substituted or unsubstituted aralkyl group, or a substituted or unsubstituted aryl group; and $Z_2$ and $Z_3$ each represents a hydrogen atom, a substituted or unsubstituted alkyl group, a substituted or unsubstituted aralkyl group or a substituted or unsubstituted aryl group.

$R_2$, $R_3$, $Z_1$, $Z_2$, and $Z_3$ each preferably represents a substituted or unsubstituted alkyl group having 1 to 18 carbon atoms, a substituted or unsubstituted aralkyl group having 7 to 21 carbon atoms, or a substituted or unsubstituted aryl group having 6 to 20 carbon atoms, still preferably a substituted or unsubstituted alkyl group having 1 to 10 carbon atoms, a substituted or unsubstituted aralkyl group having 7 to 11 carbon atoms or a substituted or unsubstituted aryl group having 6 to 10 carbon atoms.

Substituents on the alkyl, aralkyl or aryl group as represented by $R_2$, $R_3$, $Z_1$, $Z_2$, and $Z_3$, if any, include an alkyl group, an aryl group, a hydroxyl group, an alkoxy group, an aryloxy group, an alkylthio group, an arylthio group, an alkylcarbonyl group, an arylcarbonyl group, an alkoxycarbonyl group, an acyloxy group, a carbamoyl group, an acylamino group, a halogen atom, and a cyano group, preferably an alkyl group having 1 to 18 carbon atoms, an aryl group having 6 to 20 carbon atoms, a hydroxyl group, an alkoxy group having 1 to 18 carbon atoms, an aryloxy group having 6 to 20 carbon atoms, an alkylthio group having 1 to 18 carbon atoms, an arylthio group having 6 to 20 carbon atoms, an alkylcarbonyl group having 2 to 25 carbon atoms, an arylcarbonyl group having 7 to 35 carbon atoms, an alkoxycarbonyl group having 2 to 25 carbon atoms, an acyloxy group having 2 to 20 carbon atoms, a carbamoyl group having 2 to 37 carbon atoms, an acylamino group having 2 to 35 carbon atoms, a halogen atom, and a cyano group.

From the standpoint of oil solubility, the total carbon atom number in $R_1$, $R_2$, and $R_3$ is preferably 12 or more, especially 14 or more.

The acid anion represented by X includes anions of polyfluoroalkylcarboxylic acids having 1 to 9 carbon atoms, polyfluoroalkylsulfonic acids having 1 to 9 carbon atoms, boron tetrafluoride, tetraphenylboron, hexafluorophosphoric acid, aromatic carboxylic acids, and aromatic sulfonic acids. The acid anion may form a complex with zinc chloride, cadmium chloride, tin chloride, etc. to further stabilize the diazonium salt.

The diazo compound of formula (I) preferably has a melting point of from 30° to 200° C. and, for easy handling, still preferably from 50° to 150° C.

Since the diazo compound is dissolved in an appropriate solvent (e.g., tricresyl phosphate) for microencapsulation, it is preferable for the diazo compound off formula (I) to have proper solubility in the solvent, particularly at least 5%, and low solubility in water, particularly not more than 1%.

The diazo compound of formula (I) is used in a heat-sensitive recording layer preferably in an amount of from 0.02 to 3 g/m$^2$ and, for obtaining a high color density, still preferably in an amount of from 0.1 to 2 g/m$^2$.

In formula (II), at least one of $Y_1$ and $Y_2$ preferably represents a substituted or unsubstituted alkyl group having 1 to 30 carbon atoms, a substituted or unsubstituted aralkyl group having 7 to 47 carbon atoms or a substituted or unsubstituted aryl group having 6 to 46 carbon atoms, still preferably a substituted or unsubstituted alkyl group having 1 to 30 carbon atoms or a substituted or unsubstituted aryl group having 6 to 46 carbon atoms.

The substituents on the alkyl, aralkyl or aryl group represented by $Y_1$ or $Y_2$, if any, include an alkyl group having 1 to 18 carbon atoms, an aryl group having 6 to 20 carbon atoms, a hydroxyl group, an alkoxy group having 1 to 18 carbon atoms, an aryloxy group having 6 to 20 carbon atoms, an alkylthio group having 1 to 18 carbon atoms, an arylthio group having 6 to 20 carbon atoms, an alkylcarbonyl group having 2 to 25 carbon atoms, an arylcarbonyl group having 7 to 35 carbon atoms, an alkoxycarbonyl group having 2 to 25 carbon atoms, an acyloxy group having 2 to 20 carbon atoms, a carbamoyl group having 2 to 37 carbon atoms, an acylamino group having 2 to 35 carbon atoms, an alkylsulfonyl group having 2 to 20 carbon atoms, an arylsulfonyl group having 7 to 20 carbon atoms, an alkylamino group having 1 to 20 carbon atoms, an arylamino group having 6 to 20 carbon atoms, a heterocyclic group, a halogen atom, a cyano group, and a nitro group, each of which may, if possible, be further substituted.

$Y_1$ and $Y_2$ may be connected together to form an intermolecular dimer or a trimer.

Preferred couplers of formula (II) are, for example, represented by formula (III) and (IV):

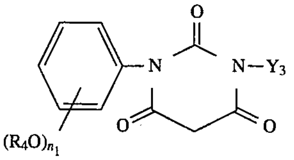

(III)

wherein $Y_3$ represents a hydrogen atom, a substituted or unsubstituted alkyl group, a substituted or unsubstituted aralkyl group or a substituted or unsubstituted aryl group; $R_4$ represents a substituted or unsubstituted alkyl group, a substituted or unsubstituted aralkyl group or a substituted or unsubstituted aryl group; and $n_1$ represents an integer of 1 to 5.

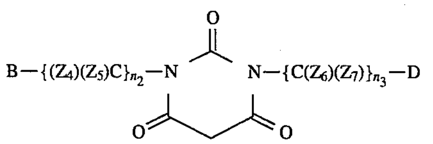

(IV)

wherein $Z_4$, $Z_5$, $Z_6$, and $Z_7$ each represents a hydrogen atom, a substituted or unsubstituted alkyl group, a substituted or unsubstituted aralkyl group or a substituted or unsubstituted aryl group; B and D each represents a cyano group, an alkoxycarbonyl group, an alkylsulfonyl group, an arylsulfonyl group or a carbamoyl group; and $n_2$ and $n_3$ each represents an integer of 1 to 4.

In formula (III), $Y_3$ preferably represents a hydrogen atom, a substituted or unsubstituted alkyl group having 1 to 30 carbon atoms, a substituted or unsubstituted aralkyl group having 7 to 47 carbon atoms or a substituted or unsubstituted aryl group having 6 to 46 carbon atoms, still preferably a substituted or unsubstituted alkyl group having 1 to 30 carbon atoms or a substituted or unsubstituted aryl group having 6 to 46 carbon atoms.

Substituents, if any, on the alkyl, aralkyl or aryl group, which may represent $Y_3$, include an alkyl group having 1 to 18 carbon atoms, an aryl group having 6 to 20 carbon atoms, a hydroxyl group, an alkoxy group having 1 to 18 carbon atoms, an aryloxy group having 6 to 20 carbon atoms, an alkylthio group having 1 to 18 carbon atoms, an arylthio group having 6 to 20 carbon atoms, an alkylcarbonyl group having 2 to 25 carbon atoms, an arylcarbonyl group having 7 to 35 carbon atoms, an alkoxycarbonyl group having 2 to 25 carbon atoms, an acyloxy group having 2 to 20 carbon atoms, a carbamoyl group having 2 to 37 carbon atoms, an acylamino group having 2 to 35 carbon atoms, an alkylsulfonyl group having 2 to 20 carbon atoms, an arylsulfonyl group having 7 to 20 carbon atoms, an alkylamino group having 1 to 20 carbon atoms, an arylamino group having 6 to 20 carbon atoms, a heterocyclic group, a halogen atom, a cyano group, and a nitro group.

$R_4$ preferably represents a substituted or unsubstituted alkyl group having 1 to 25 carbon atoms, a substituted or unsubstituted aralkyl group having 7 to 21 carbon atoms or a substituted or unsubstituted aryl group having 6 to 20 carbon atoms, still preferably a substituted or unsubstituted alkyl group having 1 to 10 carbon atoms, a substituted or unsubstituted aralkyl group having 7 to 11 carbon atoms or a substituted or unsubstituted aryl group having 6 to 10 carbon atoms.

Substituents, if any, on $R_4$ include an alkyl group, an aryl group, a hydroxyl group, an alkoxy group, an aryloxy group, an alkylthio group, an arylthio group, an acyl group, an alkoxycarbonyl group, an acyloxy group, a carbamoyl group, an acylamino group, a halogen atom, and a cyano group.

In formula (IV), $Z_4$, $Z_5$, $Z_6$, and $Z_7$ each preferably represents a hydrogen atom, a substituted or unsubstituted alkyl group having 1 to 18 carbon atoms, a substituted or unsubstituted aralkyl group having 7 to 21 carbon atoms or a substituted or unsubstituted aryl group having 6 to 20 carbon atoms, still preferably a hydrogen atom or a substituted or unsubstituted alkyl group having 1 to 6 carbon atoms.

Substituents on $Z_4$, $Z_5$, $Z_6$ and $Z_7$, if any, include an alkyl group, an aryl group, a hydroxyl group, an alkoxy group, an aryloxy group, an alkylthio group, an arylthio group, an acyl group, an alkoxycarbonyl group, an acyloxy group, a carbamoyl group, an acylamino group, a halogen atom, and a cyano group.

B and D each preferably represents a cyano group, an alkoxycarbonyl group having 2 to 27 carbon atoms, an alkylsulfonyl group having 2 to 20 carbon atoms, an arylsulfonyl group having 7 to 20 carbon atoms or a carbamoyl group having 2 to 37 carbon atoms, still preferably an alkoxycarbonyl group having 10 to 27 carbon atoms.

In formula (IV), $n_2$ and $n_3$ each preferably represents 1.

Of the compounds represented by formula (III), particularly preferred are those in which $Y_3$ is $-Ar\!-\!(OR_5)_{n4}$ or $-\{C(Z_8)(Z_9)\}_{n5}-E$, wherein Ar represents a substituted or unsubstituted aryl group; $R_5$ has the same meaning as $R_4$; $n_4$ represents an integer of 1 to 5; $Z_8$ and $Z_9$ each represents a hydrogen atom, a substituted or unsubstituted alkyl group, a substituted or unsubstituted aralkyl group or a substituted or unsubstituted aryl group; E represents a cyano group, an alkoxycarbonyl group, an alkylsulfonyl group, an arylsulfonyl group or a carbamoyl group; and $n_5$ represents an integer of 1 to 4.

$Z_8$ and $Z_9$ each preferably represents a hydrogen atom, a substituted or unsubstituted alkyl group having 1 to 18 carbon atoms, a substituted or unsubstituted aralkyl group having 7 to 21 carbon atoms or a substituted or unsubstituted aryl group having 6 to 20 carbon atoms, still preferably a hydrogen atom or a substituted or unsubstituted alkyl group having 1 to 6 carbon atoms.

Substituents on $Z_8$ and $Z_9$, if any, include an alkyl group, an aryl group, a hydroxyl group, an alkoxy group, an aryloxy group, an alkylthio group, an arylthio group, an acyl group, an alkoxycarbonyl group, an acyloxy group, a carbamoyl group, an acylamino group, a halogen atom, and a cyano group.

E preferably represents a cyano group, an alkoxycarbonyl group having 2 to 27 carbon atoms, an alkylsulfonyl group having 2 to 20 carbon atoms, an arylsulfonyl group having 7 to 20 carbon atoms or a carbamoyl group having 2 to 37 carbon atoms, still preferably an alkoxycarbonyl group having 10 to 27 carbon atoms.

$n_5$ preferably represents 1.

Specific but non-limiting examples of the diazo compound according to the present invention are as follows.

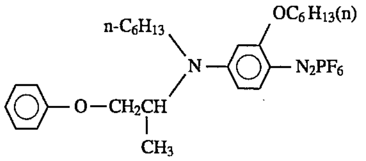

(A)

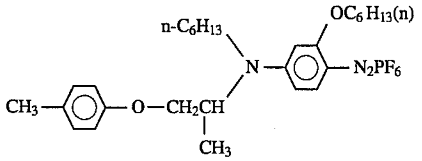

(B)

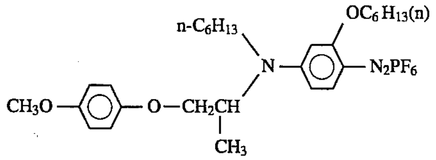

(C)

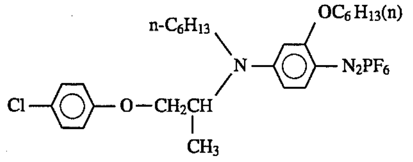

(D)

-continued
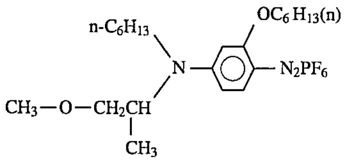
(E)
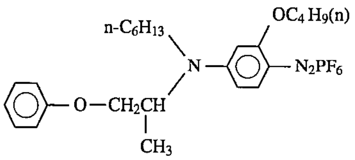
(F)
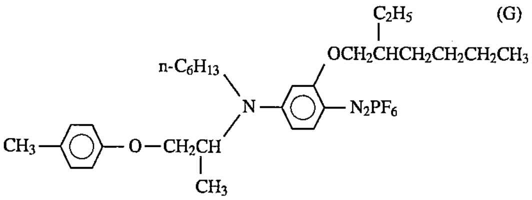
(G)
(H)
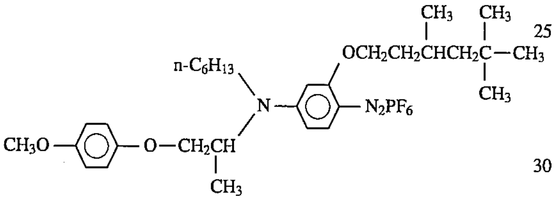
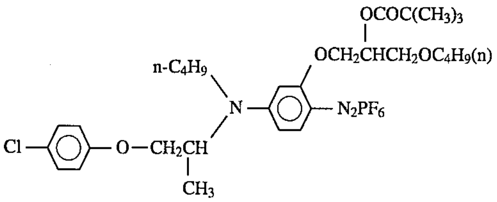
(I)
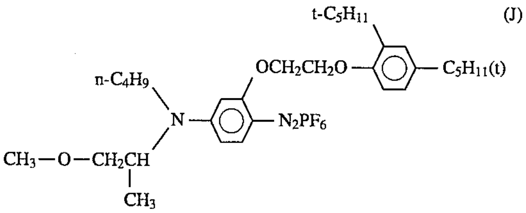
(J)
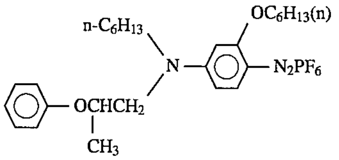
(K)
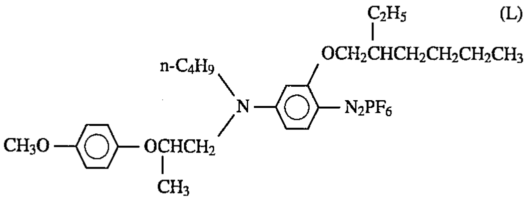
(L)
-continued
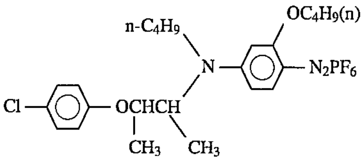
(M)
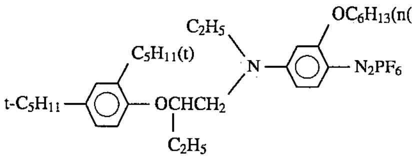
(N)
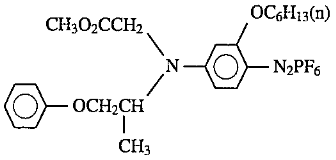
(O)
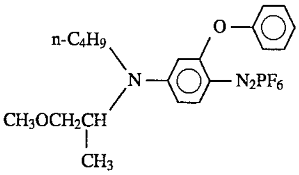
(P)
(Q)
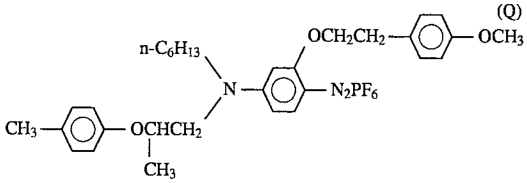
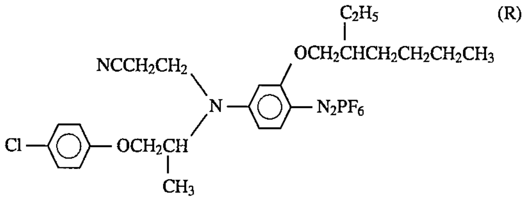
(R)
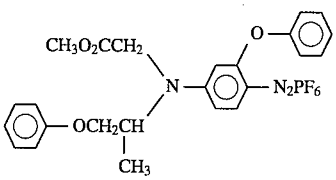
(S)
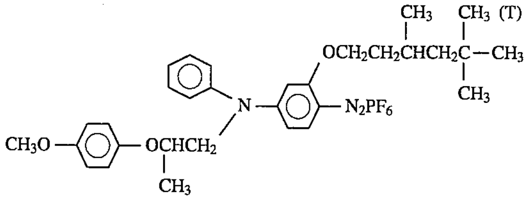
(T)
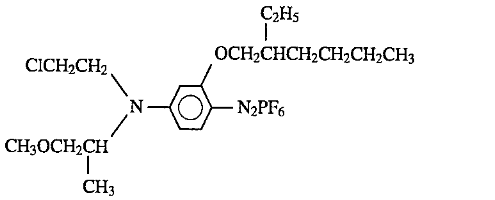
(U)

The diazo compounds of the present invention may be used either individually or in combination of two or more thereof. They may also be used in combination with other known diazo compounds, if necessary, for the purpose of, for example, hue control.

Suitable known diazo compounds which may be used in combination with the diazo compounds of the present invention, include 4-diazo-1-dimethylaminobenzene, 4-diazo-2-butoxy-5-chloro- 1-dimethylaminobenzene, 4-diazo-1-methylbenzylaminobenzene, 4-diazo-1-ethylhydroxyethylaminobenzene, 4-diazo-1-diethylamino-3-methoxybenzene, 4-diazo-1-morpholinobenzene, 4-diazo-1-morpholino- 2,5-dibutoxybenzene, 4-diazo-1-toluylmercapto-2,5-diethoxybenzene, 4-diazo-1-piperazino-2-methoxy-5-chlorobenzene, 4-diazo-1-(N,N-dioctylaminocarbonyl)benzene, 4-diazo- 1-(4-tert-octylphenoxy)benzene, 4-diazo-1-(2-ethylhexanoylpiperidino)- 2,5-dibutoxybenzene, 4-diazo-1-[α-( 2,4-di-tert-amylphenoxy)butyrylpiperidino]benzene, 4-diazo-1-( 4-methoxy)phenylthio-2,5-diethoxybenzene, 4-diazo-1-(4-methoxy)benzamido- 2,5-diethoxybenzene, and 4-diazo-1-pyrrolidino- 2-methoxybenzene.

Specific but non-limiting examples of the couplers according to the present invention are shown below.

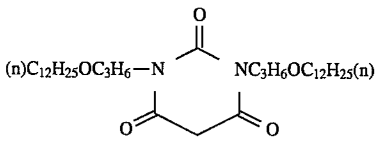
(II-1)

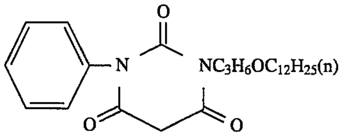
(II-2)

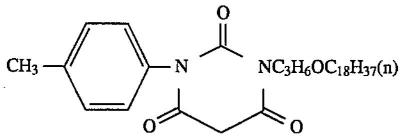
(II-3)

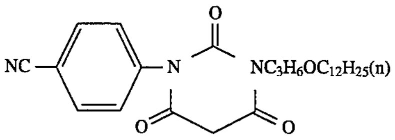
(II-4)

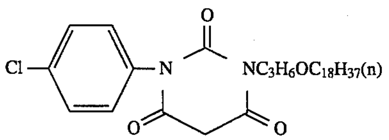
(II-5)

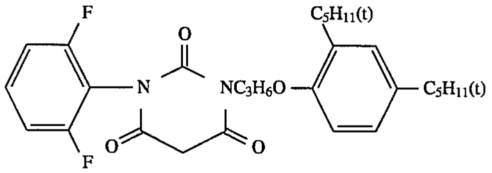
(II-6)

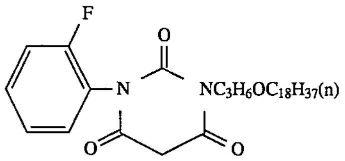
(II-7)

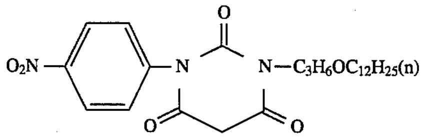
(II-8)

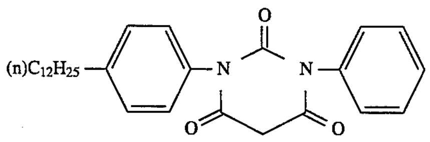
(II-9)

-continued
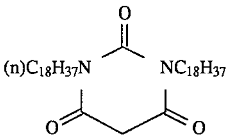
(II-10)
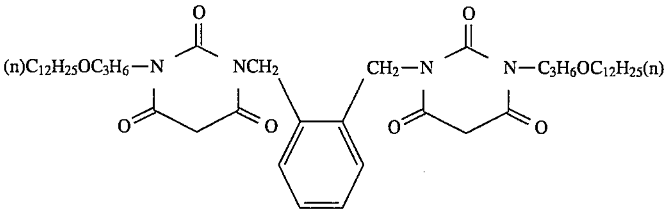
(II-11)
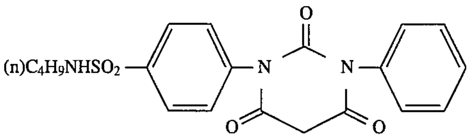
(II-12)
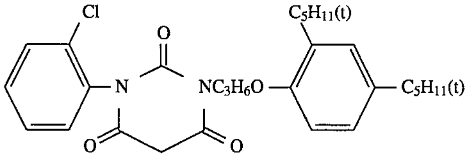
(II-13)
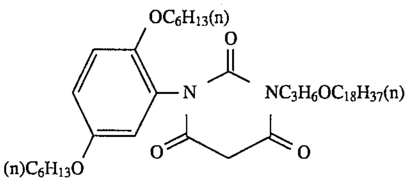
(III-1)
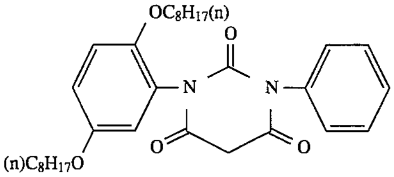
(III-2)
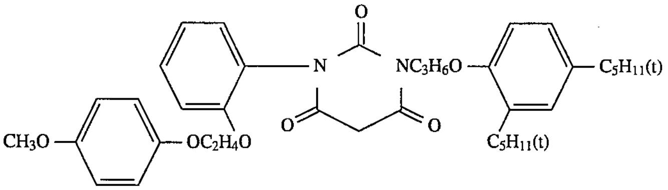
(III-3)
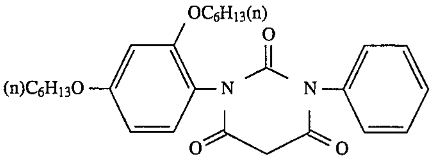
(III-4)
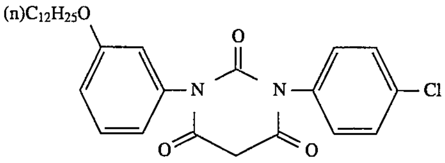
(III-5)

-continued
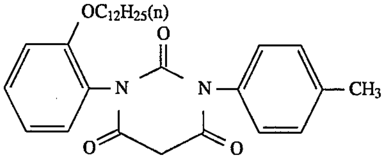
(III-6)
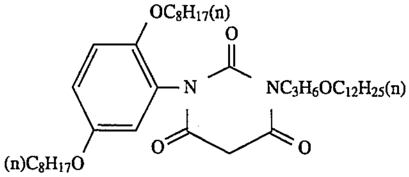
(III-7)
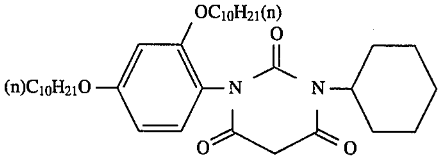
(III-8)
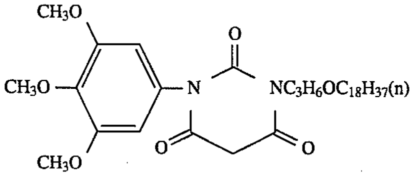
(III-9)
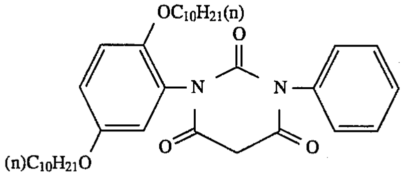
(III-10)
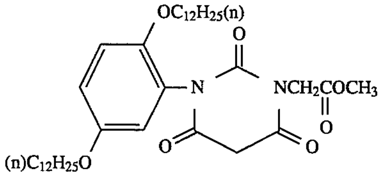
(III-11)
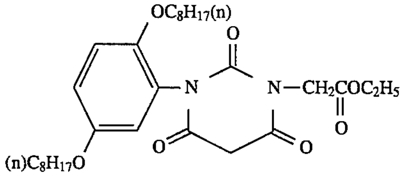
(III-12)
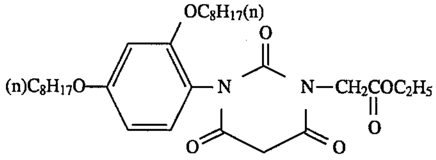
(III-13)
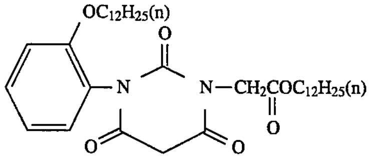
(III-14)

-continued
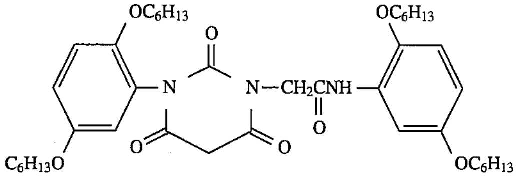
(III-15)
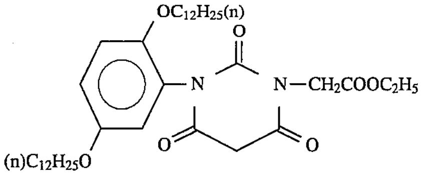
(III-16)
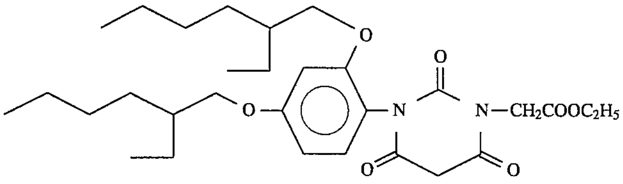
(III-17)
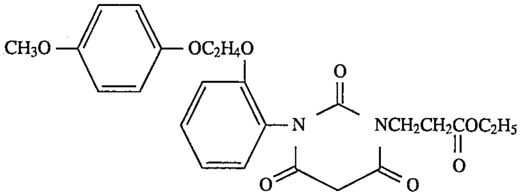
(III-18)
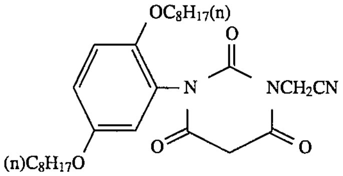
(III-19)
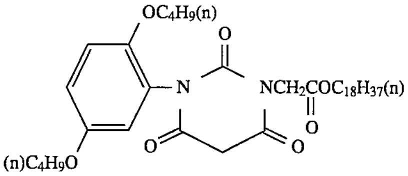
(III-20)
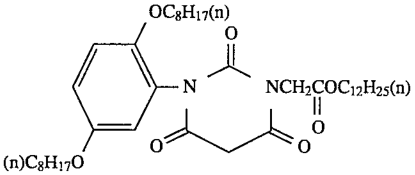
(III-21)
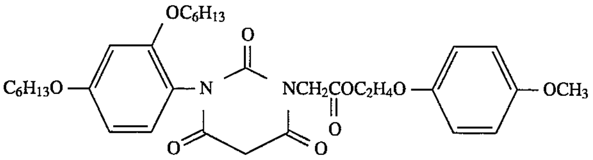
(III-22)
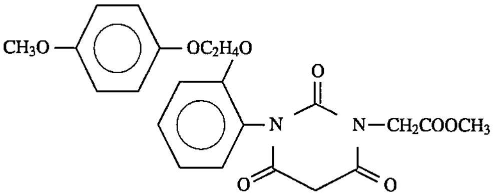
(III-23)

-continued
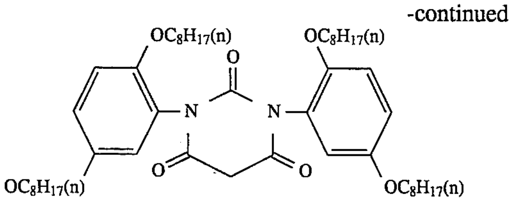
(III-24)
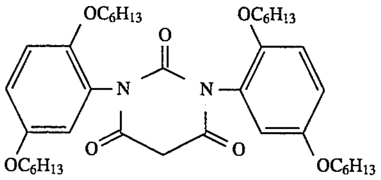
(III-25)
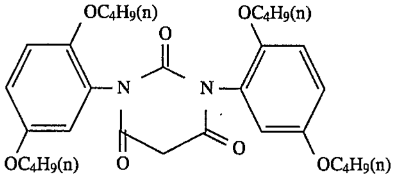
(III-26)
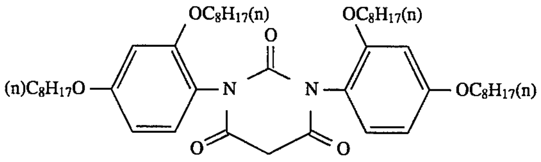
(III-27)
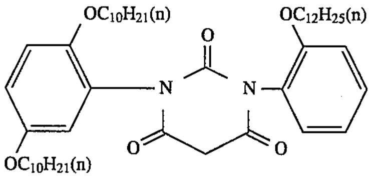
(III-28)
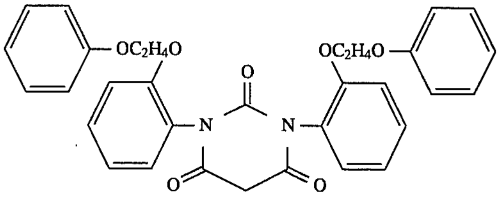
(III-29)
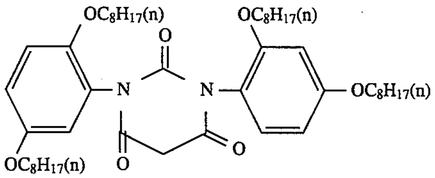
(III-30)
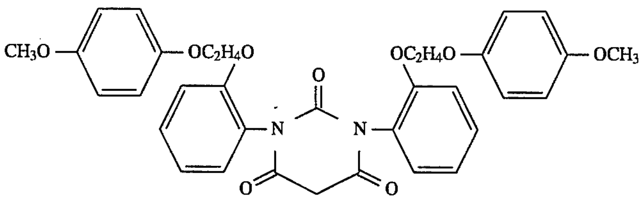
(III-31)
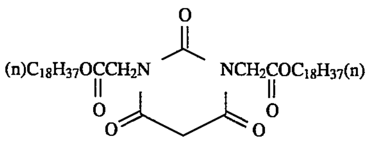
(IV-1)

-continued (IV-2)

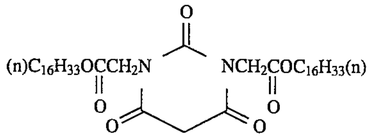

(IV-3)

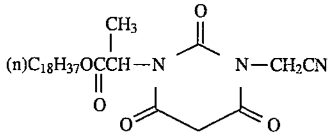

(IV-4)

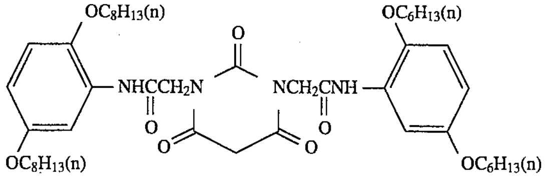

(IV-5)

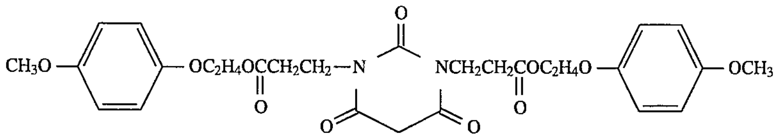

(IV-6)

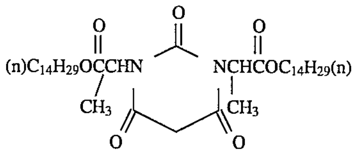

(IV-7)

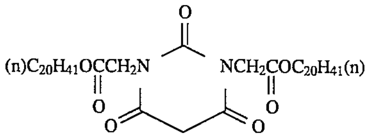

(IV-8)

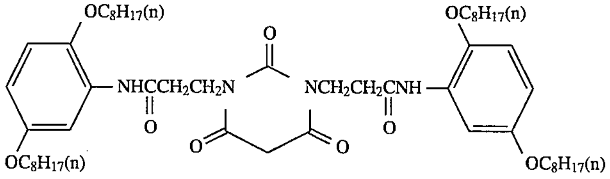

(IV-9)

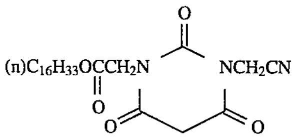

(IV-10)

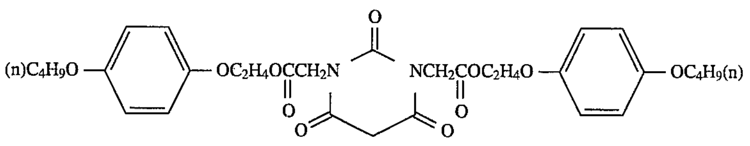

The couplers according to the present invention may be used either individually or in combination of two or more thereof. They may also be used in combination with other known couplers, if necessary for the purpose of, for example, hue control. Any known compounds capable of coupling with a diazo compound in a basic atmosphere to form a dye, such as an active methylene compound having a methylene group next to a carbonyl group, a phenol derivative or a naphthol derivative, may be used in combination therewith in such an amount that the objects of the present invention are met. Specific examples of useful couplers are resorcin, phloroglucin, sodium 2,3-dihydroxynaphthalene- 6-sulfonate, 1-hydroxy-2-naphthoic acid morpholinopropylamide, 1,5-dihydroxynaphthalene, 2,3-dihydroxynaphthalene, 2,3-dihydroxy-6-sulfo-naphthalene, 2-hydroxy- 3-naphthoic acid morpholinopropylamide, 2-hydroxy-3naphthoic acid octylamide, 2-hydroxy-3-naphthoic acid anilide, benzoyl acetanilide, 1-phenyl-3-methyl-5-pyrazolone, 1-(2,4,6-trichlorophenyl)- 3-anilino-5-pyrazolone,2-{3-[α-(2,4-di-tert-amylphenoxy)-butanamido]

benzamido}phenol, 2,4-bis(benzoylacetamino)toluene, and 1,3-bis(pivaloylacetaminomethyl)benzene.

A process for preparing microcapsules containing the diazonium salt of the present invention is described below.

A diazonium salt is dissolved in a high-boiling hydrophobic solvent serving as the core of a capsule (oily phase). If desired, a low-boiling solvent may be used in combination as an auxiliary solvent. In some cases, a low-boiling solvent alone may serve for this purpose but, in this case, the resulting capsules would have no distinct core. To the solvent as a core is added a polyisocyanate compound as a wall-forming component. Separately, an aqueous solution of a water-soluble high polymer, such as polyvinyl alcohol or gelatin, is prepared as an aqueous phase. The oily phase is poured into the aqueous phase and emulsified by means of a homogenizer, etc. The water-soluble high polymer acts as a stabilizer of the emulsion. For further stabilization of the emulsion system, a surface active agent may be added to one or both of the oily phase and the aqueous phase. The dispersed particles usually have a particle size of from about 0.2 to 10 μm. Polymerization reaction of the polyisocyanate compound thus takes place on the interface between the oily and aqueous phases to form a polyurea wall. Where a polyol is previously added to the aqueous phase, a reaction between the polyisocyanate compound and the polyol takes place to form a polyurethane wall. Such is effective for obtaining an increased reaction rate to keep the reaction temperature high or to add an appropriate catalyst for polymerization. For the details of the polyisocyanate compound, polyol, catalyst, or polyamine to be used as a wall-forming component, refer to such references as Keiji Iwata (ed.), *Polyurethane Handbook,* The Nikkan Kogyo Shimbun Ltd. (1987).

The hydrophobic solvent which dissolves the diazonium salt to provide a microcapsule core preferably includes organic solvents having a boiling point of 100° to 300° C., such as an alkylnaphthalene, an alkyldiphenylethane, an alkyldiphenylmethane, an alkylbiphenyl, chlorinated paraffin, tricresyl phosphate, maleic esters, adipic esters, sulfuric esters, and sulfonic esters. These organic solvents may be used either individually or in combination of two or more thereof. If a diazonium salt to be encapsulated has insufficient solubility in the solvent selected, a low-boiling solvent highly capable of dissolving the diazonium salt may be used in combination therewith. For example, ethyl acetate, butyl acetate, methylene chloride, tetrahydrofuran, acetone, etc. may be used as an auxiliary solvent. Where such a low-boiling solvent is used alone as a capsule core, the solvent evaporates during the encapsulating reaction to provide so-called coreless microcapsules in which the diazonium compound exists as an integral part of the capsule wall.

The polyisocyanate compound forming the microcapsule wall preferably includes those containing a tri- or higher functional isocyanate group, which may be used in combination with a difunctional isocyanate compound. Examples of suitable polyisocyanate compounds include those prepared mainly from a diisocyanate compound (e.g., xylene diisocyanate or a hydrogenation product thereof, hexamethylene diisocyanate, tolylene diisocyanate or a hydrogenation product thereof, or isophorone diisocyanate), such as dimers or trimers of these diisocyanate compounds (e.g., biuret or isocyanurate), an adduct between these diisocyanate compounds and polyols, e.g., trimethylolpropane, and a condensation product between benzene isocyanate and formalin.

A polyol or a polyamine may previously be added to the hydrophobic solvent as a core or a water-soluble high polymer solution as a dispersing medium so as to act as one of the microcapsule wall-forming components. Examples of the polyol or polyamine include propylene glycol, glycerin, trimethylolpropane, triethanolamine, sorbitol, and hexamethylenediamine. When using a polyol, a polyurethane wall is formed.

The water-soluble high polymer used in the aqueous solution as a dispersing medium for the oily phase preferably includes those having a water solubility of at least 5 at the emulsifying temperature. Examples of such water-soluble high polymers include poly(vinyl alcohol) and its modified products, polyacrylamide and its derivatives, an ethylene-vinyl acetate copolymer, a styrene-maleic anhydride copolymer, an ethylene-maleic anhydride copolymer, an isobutylene-maleic anhydride copolymer, poly(vinylpyrrolidone), an ethylene-acrylic acid copolymer, a vinyl acetate-acrylic acid copolymer, carboxymethyl cellulose, methyl cellulose, casein, gelatin, starch derivatives, gum arabic, and sodium alginate. These water-soluble high polymers should have no or low reactivity with the aforesaid isocyanate compound. For example, a water-soluble high polymer having a reactive amino group in a molecule, such as gelatin, should previously be modified to lose its reactivity.

Where a surface active agent is used, it is preferably added in an amount of from 0.1 to 5%, still preferably from 0.5 to 2%, by weight based on the oily phase.

Emulsification can be effected by means of a known emulsifier, e.g., a homogenizer, Manton gaulin, an ultrasonic dispersing machine or KADY MILL. After emulsification, the emulsion is heated to 30° to 70° C. to accelerate capsule wall formation. In order to prevent agglomeration of capsules during the reaction, it is necessary to add water to decrease the probability of collisions among capsules or to stir the reaction system sufficiently. It is also effective to add a dispersant for prevention of agglomeration to the reaction system. Evolution of carbon dioxide is observed with the progress of the polymerization reaction, and termination of the evolution of carbon dioxide is taken as the end point of the capsule wall formation. After several hours, the reaction usually results in formation of the desired diazonium salt-containing microcapsules.

For acceleration of the reaction between a diazonium salt and a coupler, at least one organic base is added to the reaction system. The organic bases include nitrogen-containing compounds, such as tertiary amines, piperidines, piperazines, amidines, formamidines, pyridines, guanidines and morpholines.

Examples of suitable organic bases include piperazines, such as N,N'-bis(3-phenoxy-2-hydroxypropyl)piperazine, N,N'-bis[3-(p-methylphenoxy)-2-hydroxypropyl]piperazine, N,N'-bis[3-(p-methoxyphenoxy)- 2-hydroxypropyl] piperazine, N,N'-bis(3-phenylthio- 2-hydroxypropyl)piperazine, N,N'-bis[3-(β-naphthoxy)- 2-hydroxypropyl] piperazine, N-3-(β-naphthoxy)-2-hydroxypropyl-N'-methylpiperazine, and 1,4-bis{[3-(N-methylpiperazino)-2-hydroxy]propyloxy}benzene; morpholines, such as N-[3-(β-naphthoxy)-2-hydroxy]propylmorpholine, 1,4-bis[(3-morpholino-2-hydroxy)propyloxy]benzene, and 1,3-bis[(3-morpholino- 2-hydroxy)propyloxy]benzene; piperidines, such as N-( 3-phenoxy-2-hydroxypropyl)piperidine and N-dodecylpiperidine; and guanidines, such as triphenylguanidine, tricyclohexylguanidine, and dicyclohexylphenylguanidine.

The coupler is used preferably in an amount of from 0.1 to 30 parts by weight per part by weight of the diazo compound. The organic base is used preferably in an amount of from 0.1 to 30 parts by weight per part by weight of the diazo compound.

In addition to the above-mentioned organic base, a color formation assistant may be added to the heat-sensitive recording layer to accelerate the color formation reaction. A color formation assistant is a substance capable of increasing the density of the color developed on heat recording or is a substance capable of lowering the minimum temperature for color formation. That is, a color formation assistant functions to reduce the fusing point of a diazonium salt, a coupler or an organic base or functions to lower the softening point of the capsule wall to thereby further facilitate the reaction involving the diazonium salt, the organic base and the coupler.

Suitable color formation assistants include phenol derivatives, naphthol derivatives, alkoxy-substituted benzene derivatives, alkoxy-substituted naphthalene derivatives, hydroxy compounds, amide compounds, and sulfonamide compounds. These compounds seem to lower the melting point of an organic base or to improve heat transmission of microcapsule walls so that heat development may be conducted rapidly and completely with reduced energy thereby to provide a high color density.

Heat fusible substances are also useful as a color formation assistant. Heat fusible substances are substances having a melting point of 50° to 150° C. which are solid at room temperature and are fused on heating to dissolve a diazo compound, a coupler or an organic base. Examples of such heat fusible substances include carboxylic acid amides, N-substituted carboxylic acid amides, ketone compounds, urea compounds, and esters.

For the purpose of improving light- and heat-fastness of a color image developed or of reducing yellowing of the background (non-image area) after fixation, it is effective to add known additives, such as antioxidants, to the recording material of the present invention. Examples of useful additives for that purpose are described in EP 310551, German Patent Publication 3435443, EP 310552, JP-A-3-121449, EP 459416, JP-A-2-262654, JP-A-2-71262, JP-A-63-163351, U.S. Pat. No. 4,814,262, JP-A-54-48535, JP-A-5-61166, JP-A-5-119449, U.S. Pat. No. 4,980,275, JP-A-63-113536, JP-A-62-262047, EP 223739, EP 309402 and EP 309401.

It is also effective to use various known additives contained in heat-sensitive materials and pressure-sensitive materials.

Specific examples of these known antioxidants are 6-ethoxy- 1-phenyl-2,2,4-trimethyl-1,2-dihydroxyquinoline, 6-ethoxy- 1-octyl-2,2,4-trimethyl-1,2-dihydroquinoline,6-ethoxy- 1-phenyl-2,2,4-trimethyl-1,2,3,4-tetrahydroquinoline, 6-ethoxy- 1-octyl-2,2,4-trimethyl-1,2,3,4-tetrahydroquinoline, nickel cyclohexanoate, 2,2-bis(4-hydroxyphenylpropane), 1,1-bis-4-hydroxyphenyl-2-ethylhexane, 2-methyl-4-methoxydiphenylamine, and 1-methyl-2-phenylindole as described in JP-A-60-125470, JP-A- 60-125471, JP-A-60-125472, JP-A-60-287485, JP-A-60-287486, JP-A-60-287487, JP-A-60-287488, JP-A-62-146678, JP-A-62-146680, JP-A-62-146679, JP-A-60-287488, JP-A-62-282885, JP-A-63-89877, JP-A-63-88380, JP-A-63-88381, JP-A-1-239282, JP-A-4-291685, JP-A-4-291684, JP-A-5-188687, JP-A-5-188686, JP-A-5-110490, JP-A- 5-1108437, JP-A-5-170361, JP-A-63-203372, JP-A-63-224989, JP-A- 63-267594, JP-A-63-182484, JP-A-60-107384, JP-A-60-107383, JP-A- 61-160287, JP-A-61-185483, JP-A-61-211079, JP-A-63-251282, JP-A-63-51174, JP-B-48-43294 (the term "JP-B" as used herein means an examined published Japanese patent application), and JP-B-48-33212.

The antioxidant is preferably used in an amount of 0.05 to 100 parts by weight, particularly 0.2 to 30 parts by weight, per part by weight of the diazo compound.

The antioxidant may be incorporated into microcapsules together with the diazo compound and/or dispersed as a solid or emulsified with the aid of an emulsifying agent together with a coupler, a organic base, a color formation assistant, etc. It may also be added to or present in a protective layer (hereinafter described) of the recording material. These antioxidants may be used either individually or in combination of two or more thereof. Classifying these antioxidants by structure into groups, such as anilines, alkoxybenzenes, hindered phenols, hindered amines, hydroquinone derivatives, phosphorus compounds, sulfur compounds, etc., the combination of two or more antioxidants may be selected from the same group or different groups.

The coupler, organic base, color formation assistant, and other necessary components may be dispersed as solid particles together with a water-soluble high polymer by means of a sand mill, etc. but are preferably used as an emulsion prepared by using an appropriate emulsifying agent. The water-soluble high polymer which can be used in the preparation of the microcapsules can also preferably be used here (see, for example, JP-A-59-190886). In this case, a coupler, an organic base, and a color formation assistant are each added in an amount of 5 to 40% by weight based on the water-soluble high polymer aqueous solution. The dispersed or emulsified particles preferably have a particle size of not greater than 10 μm.

For the purpose of reducing yellowing of the background after fixation, the recording material of the present invention may contain a free radical generator (a compound releasing a free radical on exposure to light) generally employed in photopolymerizable compositions. Suitable free radical generators include aromatic ketones, quinones, benzoin, benzoin ethers, azo compounds, organic disulfide compounds, and acyloxime esters. The free radical generator is preferably used in an amount of from 0.01 to 5 parts by weight per part by weight of the diazo compound.

For the same purpose, it is also effective to use an ethylenically unsaturated polymerizable compound, inclusive of not only a monomer but a prepolymer, having at least one ethylenically unsaturated bond (e.g., a vinyl group or a vinylidene group) in a molecule (hereinafter referred to as a vinyl monomer). Examples of the vinyl monomers include unsaturated carboxylic acids and their salts, esters with aliphatic polyhydric alcohols, and amides with aliphatic polyamine compounds. The vinyl monomer is used in an amount of from 0.2 to 20 parts by weight per part by weight of the diazo compound.

The above-mentioned free radical generator and vinyl monomer may be incorporated into microcapsules together with the diazo compound.

The recording material of the present invention may further contain acid stabilizers, such as citric acid, tartaric acid, oxalic acid, boric acid, phosphoric acid, pyrophosphoric acid, and so on.

The recording material of the present invention is prepared by coating a support, such as paper or a synthetic resin film, with a coating composition containing diazo compound-containing microcapsules, a coupler, an organic base and other desirable additives, by bar coating, blade coating, air knife coating, gravure coating, roll coating, spray coating, dip coating, curtain coating, etc., followed by drying to form a heat-sensitive recording layer desirably having a solid content of 2.5 to 30 $g/m^2$. The microcapsules, coupler, base, etc. may be present in one layer or separate layers of a laminate structure. An intermediate layer may be provided between a support and a heat-sensitive recording layer as described in JP-A-61-54980.

The support which can be used in the present invention includes any kind of paper support used in general pressure-sensitive or heat-sensitive recording paper and general diazo type paper for a dry or wet process and, in addition, neutral paper having a pH between 5 and 9, sized with a neutral sizing agent, such as an alkylketone dimer; paper satisfying a specific relationship between a Stöckigt sizing degree and a basis weight and having a Bekk smoothness of not less than 90 seconds (JP-A-57-116687); paper having an optical surface roughness of not greater than 8 μm and a thickness of 30 to 150 μm (JP-A-58-136492); paper having a density of not more than 0.9 $g/cm^3$ and an optical contact ratio of not less than 15% (JP-A-58-69091); paper resistant to penetration of a coating composition which is made from pulp beaten to a C.S. freeness (measured according to JIS P8121) of not less than 400 cc (JP-A-58-69097); paper produced by a Yankee machine, on the glossy side of which is to be provided a recording layer to obtain increased color density and increased resolving power (JP-A-58-65695); and paper having been subjected to a corona discharge treatment to improve coating properties (JP-A-59- 35985).

Synthetic resin films, which can be used as a support in the present invention, include films of known materials having dimensional stability and resistance to deformation at a heat developing temperature, such as polyesters (e.g., polyethylene terephthalate and polybutylene terephthalate), cellulose derivatives (e.g., cellulose triacetate), polystyrene, and polyolefins (e.g., polypropylene and polyethylene).

The above-mentioned paper and films may be used either singly or as a laminate thereof. The support usually has a thickness of from 20 to 200 μm.

If desired, a heat-sensitive protective layer comprising poly(vinyl alcohol), etc. as a main component and various pigments, a parting agent, etc., may be provided on the heat-sensitive recording layer for prevention of sticking, prevention of contamination of a recording head, or imparting water resistance to the recording layer.

Recording on the diazo light-fixable heat-sensitive recording material of the present invention is carried out as follows. The recording layer is imagewise heated with a thermal head, etc. to soften the polyurea or polyurethane capsule wall whereby the coupler and the organic base outside the capsules enter the inside of the capsules to develop a color. After the color development, the recording layer is exposed to light having the absorption wavelength of the diazonium salt whereby the diazonium salt decomposes and loses its reactivity with the coupler. As a result, the image is fixed.

Light sources for image fixation include various fluorescent lamps, xenon lamps, and mercury lamps. It is desirable for efficient fixation that the emission spectrum of the light source substantially meets the absorption spectrum of the diazo compound used.

The present invention will now be illustrated in greater detail with reference to Examples, but it should be understood that the present invention is not construed as being limited thereto. All the parts and percents are by weight unless otherwise indicated.

EXAMPLE 1

Preparation of Capsule Dispersion A

To 19 parts of ethyl acetate were added 2.8 parts of Compound (A), as defined hereinabove, and 10 parts of tricresyl phosphate. After mixing uniformly, 7.6 parts of a polyisocyanate compound Takenate D-110N, produced by Takeda Chemical Industries, Ltd., as a wall-forming component was added to the mixture, followed by mixing uniformly to obtain Solution I.

Solution I was poured into a mixture of 46.1 parts of an 8% aqueous solution of phthalated gelatin, 17.5 parts of water, and 2 parts of a 10% aqueous solution of sodium dodecylbenzenesulfonate and emulsified at 40° C. at 10,000 rpm for 10 minutes. To the resulting emulsion was added 20 parts of water and homogenized, and the emulsion was stirred at 40° C. for 3 hours to induce encapsulation reaction to obtain Capsule Dispersion A. The capsules had a diameter of 0.35 μm.

Preparation of Coupler/Base Emulsion B

In 8 parts of ethyl acetate were dissolved 4 parts of Compound (II-2), 2 parts of triphenylguanidine, 0.64 part of tricresyl phosphate, and 0.32 part of diethyl maleate to prepare Solution II.

Separately, 32 parts of a 15% aqueous solution of lime-processed gelatin, 5 parts of a 10% aqueous solution of sodium dodecylbenzenesulfonate, and 30 parts of water were uniformly mixed. Solution II was poured into the mixture and emulsified in a homogenizer at 40° C. and 10000 rpm for 10 minutes. The resulting emulsion was further stirred at 40° C. for 2 hours to remove ethyl acetate. Water was added thereto in an amount corresponding to the evaporation loss (loss of ethyl acetate and water) to obtain Coupler/Base Emulsion B.

Preparation of Coating Composition C

Six parts of capsule dispersion A, 4.4 parts of water, and 1.9 parts of a 15% aqueous solution of lime-processed gelatin were uniformly mixed, and 8.3 parts of Coupler/Base Emulsion B was added thereto, followed by uniformly mixing to obtain Coating Composition C for a heat-sensitive recording layer.

Preparation of Coating Composition D

Thirty-two parts of a 10% aqueous solution of poly(vinyl alcohol) (degree of polymerization: 1,700; degree of saponification: 88%) and 36 parts of water were uniformly mixed to prepare Coating Composition D for a protective layer.

Coating

Polyethylene-laminated fine paper was coated successively with Coating Composition C and Coating Composition D with a wire bar to provide a solid amount of 6.4 $g/m^2$ and 1.05 $g/m^2$, respectively, and dried at 50° C. to obtain a diazo heat-sensitive recording material.

Test of Color Formation and Fixation

The resulting diazo heat-sensitive recording material was recorded using a thermal head KST Model manufactured by Kyocera Corporation. The power applied to the thermal head and the pulse width were decided so as to give a recording energy of from 0 to 40 $mJ/mm^2$. After image formation, the entire surface of the recording material was exposed to light from an ultraviolet lamp having an emission central wavelength of 365 nm and an output of 40 W for 15 seconds. The density of the image area and the background was measured with a Macbeth densitometer.

1) Raw Stock Aging Stability

Raw stock aging stability of the recording material was evaluated from a difference in density of the image area and the background between a recording material preserved at room temperature and that preserved at 60° C. and 30% RH for 72 hours (accelerated aging). The change in color density was measured with a reflection densitometer.

2) Light Fastness

A sample having a developed and fixed image was exposed to light in a fadeometer using a fluorescent lamp of 3200 lux for 24 hours to examine fading of the image area having an initial density of about 1.1 and coloration of the background with a Macbeth densitometer.

EXAMPLE 2

A diazo heat-sensitive recording material was prepared in the same manner as in Example 1, except for replacing Compound (A) with Compound (B). Recording was conducted on the resulting recording material, and the density of the image area and the background was measured with a Macbeth densitometer.

EXAMPLE 3

A diazo heat-sensitive recording material was prepared in the same manner as in Example 1, except for replacing Compound (A) with Compound (C). Recording was conducted on the resulting recording material, and the density of the image area and the background was measured with a Macbeth densitometer.

EXAMPLE 4

A diazo heat-sensitive recording material was prepared in the same manner as in Example 1, except for replacing Compound (A) with Compound (D). Recording was conducted on the resulting recording material, and the density of the image area and the background was measured with a Macbeth densitometer.

EXAMPLE 5

A diazo heat-sensitive recording material was prepared in the same manner as in Example 1, except for replacing Compound (A) with Compound (E). Recording was conducted on the resulting recording material, and the density of the image area and the background was measured with a Macbeth densitometer.

COMPARATIVE EXAMPLE 1

A diazo heat-sensitive recording material was prepared in the same manner as in Example 1, except for replacing Compound (A) with 4-N,N-dihexylamino-2-hexyloxybenzenediazonium hexafluorophosphate. Recording was conducted on the resulting recording material, and the density of the image area and the background was measured with a Macbeth densitometer.

COMPARATIVE EXAMPLE 2

A diazo heat-sensitive recording material was prepared in the same manner as in Example 1, except for replacing Compound (A) with 4-[N-(4-methoxyphenoxyethyl)-N-hexyl]amino-2-hexyloxybenzenediazonium hexafluorophosphate. Recording was conducted on the resulting recording material, and the density of the image area and the background was measured with a Macbeth densitometer.

COMPARATIVE EXAMPLE 3

A diazo heat-sensitive recording material was prepared in the same manner as in Example 1, except for replacing Compound (A) with 4-[N-(4-methoxyphenoxypropyl)-N-hexyl]amino- 2-hexyloxybenzenediazonium hexafluorophosphate. Recording was conducted on the resulting recording material, and the density of the image area and the background was measured with a Macbeth densitometer.

The results of measurement of raw stock aging stability and image stability (light fastness) in Examples 1 to 5 and Comparative Examples 1 to 3 are shown in Tables 1 and 2 below.

TABLE 1

Raw Stock Aging Stability

| Example No. | Hue $\lambda_{max}$ (nm) | Image Density Before Aging | Image Density After Aging | Background Coloration Before Aging | Background Coloration After Aging |
|---|---|---|---|---|---|
| Example 1 | 530 | 1.10 | 0.97 | 0.10 | 0.10 |
| Example 2 | 530 | 1.10 | 0.99 | 0.10 | 0.11 |
| Example 3 | 530 | 1.10 | 1.01 | 0.10 | 0.11 |
| Example 4 | 530 | 1.10 | 1.00 | 0.10 | 0.11 |
| Example 5 | 535 | 1.10 | 1.04 | 0.10 | 0.10 |
| Compara. Example 1 | 540 | 1.10 | 0.88 | 0.19 | 0.34 |
| Compara. Example 2 | 530 | 1.10 | 0.86 | 0.16 | 0.24 |
| Compara. Example 3 | 535 | 1.10 | 0.91 | 0.21 | 0.35 |

TABLE 2

Image Stability

| Example No. | Image Density Before Exposure | Image Density After Exposure | Background Coloration Before Exposure | Background Coloration After Exposure |
|---|---|---|---|---|
| Example 1 | 1.10 | 0.89 | 0.10 | 0.11 |
| Example 2 | 1.10 | 0.88 | 0.10 | 0.11 |
| Example 3 | 1.10 | 0.90 | 0.10 | 0.12 |
| Example 4 | 1.10 | 0.88 | 0.10 | 0.11 |
| Example 5 | 1.10 | 0.88 | 0.10 | 0.11 |
| Compara. Example 1 | 1.10 | 0.77 | 0.20 | 0.25 |
| Compara. Example 2 | 1.10 | 0.82 | 0.15 | 0.18 |
| Compara. Example 3 | 1.10 | 0.80 | 0.22 | 0.27 |

EXAMPLE 6

A diazo heat-sensitive recording material was prepared in the same manner as in Example 1, except for replacing Compound (II-2) with Compound (III-2) in the preparation of the coupler/base emulsion. Recording was conducted on the resulting recording material, and the density of the image area and the background was measured with a Macbeth densitometer.

EXAMPLE 7

A diazo heat-sensitive recording material was prepared in the same manner as in Example 1, except for replacing Compound (II-2) with Compound (III-7) in the preparation of the coupler/base emulsion. Recording was conducted on the resulting recording material, and the density of the image area and the background was measured with a Macbeth densitometer.

EXAMPLE 8

A diazo heat-sensitive recording material was prepared in the same manner as in Example 1, except for replacing Compound (II-2) with Compound (III-16) in the preparation of the coupler/base emulsion. Recording was conducted on the resulting recording material, and the density of the image area and the background was measured with a Macbeth densitometer.

EXAMPLE 9

A diazo heat-sensitive recording material was prepared in the same manner as in Example 1, except for replacing Compound (II-2) with Compound (III-24) in the preparation of the coupler/base emulsion. Recording was conducted on the resulting recording material, and the density of the image area and the background was measured with a Macbeth densitometer.

EXAMPLE 10

A diazo heat-sensitive recording material was prepared in the same manner as in Example 1, except for replacing Compound (II-2) with Compound (IV-1) in the preparation of the coupler/base emulsion. Recording was conducted on the resulting recording material, and the density of the image area and the background was measured with a Macbeth densitometer.

COMPARATIVE EXAMPLE 4

A diazo heat-sensitive recording material was prepared in the same manner as in Example 1, except for replacing Compound (II-2) with 5-(2-tetradecyloxyphenyl)-cyclohexane-1,3-dione in the preparation of the coupler/base emulsion. Recording was conducted on the resulting recording material, and the density of the image area and the background was measured with a Macbeth densitometer.

COMPARATIVE EXAMPLE 5

A diazo heat-sensitive recording material was prepared in the same manner as in Example 1, except for replacing Compound (II-2) with 1-phenyl-3-octyloxycarbonylpyrazol-5-one in the preparation of the coupler/base emulsion. Recording was conducted on the resulting recording material, and the density of the image area and the background was measured with a Macbeth densitometer.

COMPARATIVE EXAMPLE 6

A diazo heat-sensitive recording material was prepared in the same manner as in Example 1, except for replacing Compound (II-2) with 1,3-diphenyl-2,4,6(1H,3H,5H)-pyrimidinetrione in the preparation of the coupler/base emulsion. Recording was conducted on the resulting recording material, and the density of the image area and the background was measured with a Macbeth densitometer.

The results of measuring the raw stock aging stability and image stability (light fastness) in Examples 6 to 10 and Comparative Examples 4 to 6 are shown in Tables 3 and 4 below.

TABLE 3

| | Raw Stock Aging Stability | | | | |
|---|---|---|---|---|---|
| | Hue | Image Density | | Background Coloration | |
| Example No. | $\lambda_{max}$ (nm) | Before Aging | After Aging | Before Aging | After Aging |
| Example 6 | 535 | 1.10 | 1.01 | 0.10 | 0.11 |
| Example 7 | 535 | 1.10 | 1.02 | 0.10 | 0.11 |
| Example 8 | 535 | 1.10 | 1.03 | 0.10 | 0.11 |
| Example 9 | 535 | 1.10 | 1.02 | 0.10 | 0.11 |
| Example 10 | 530 | 1.10 | 1.03 | 0.10 | 0.11 |
| Compara. Example 4 | 540 | 1.10 | 0.93 | 0.10 | 0.12 |
| Compara. Example 5 | 580 | 1.10 | 1.00 | 0.20 | 0.25 |

TABLE 3-continued

| | Raw Stock Aging Stability | | | | |
|---|---|---|---|---|---|
| | Hue | Image Density | | Background Coloration | |
| Example No. | $\lambda_{max}$ (nm) | Before Aging | After Aging | Before Aging | After Aging |
| Compara. Example 6 | 535 | 1.10 | 0.95 | 0.10 | 0.12 |

TABLE 4

| | Image Stability | | | |
|---|---|---|---|---|
| | Image Density | | Background Coloration | |
| Example No. | Before Exposure | After Exposure | Before Exposure | After Exposure |
| Example 6 | 1.10 | 0.95 | 0.10 | 0.12 |
| Example 7 | 1.10 | 1.02 | 0.10 | 0.12 |
| Example 8 | 1.10 | 1.03 | 0.10 | 0.13 |
| Example 9 | 1.10 | 1.04 | 0.10 | 0.12 |
| Example 10 | 1.10 | 1.05 | 0.10 | 0.11 |
| Compara. Example 4 | 1.10 | 0.55 | 0.10 | 0.18 |
| Compara. Example 5 | 1.10 | 0.90 | 0.20 | 0.38 |
| Compara. Example 6 | 1.10 | 0.81 | 0.10 | 0.14 |

It can be seen from the results in Tables 1 to 4 that the diazo heat-sensitive recording materials using the diazo compounds and couplers according to the present invention exhibit excellent stability before and after recording. That is, the recording materials of the present invention undergo little change in color developing performance and retain high whiteness of the background during aging and provide a dye having excellent stability against light.

While the invention has been described in detail and with reference to specific examples thereof, it will be apparent to one skilled in the art that various changes and modifications can be made therein without departing from the spirit and scope thereof.

What is claimed is:

1. A diazo heat-sensitive recording material comprising a support having provided thereon a recording layer containing a diazo compound, a coupler, and an organic base, in which said diazo compound is a compound represented by formula (I):

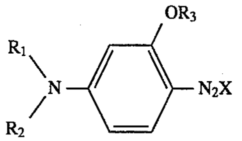

(I)

wherein $R_1$ represents $—C(Z_1)(Z_2)—CH_2—A$, $—CH_2—C(Z_1)(Z_2)—A$ or $—\{C(Z_1)(Z_2)\}_m—A$, wherein $Z_1$ represents a substituted or unsubstituted alkyl group, a substituted or unsubstituted aralkyl group or a substituted or unsubstituted aryl group; $Z_2$ represents a hydrogen atom, a substituted or unsubstituted alkyl group, a substituted or unsubstituted aralkyl group or a substituted or unsubstituted aryl group; A represents a halogen atom, an acyl group, a cyano group, or a group containing at least one oxygen, nitrogen, phosphorus or sulfur atom through which A is bonded to $—CH_2—$ or $Z_2$; and m represents an integer of 1 to 5;

$R_2$ and $R_3$, which may be the same or different, each represents a substituted or unsubstituted alkyl group, a substituted or unsubstituted aralkyl group or a substituted or unsubstituted aryl group; $R_1$ and $R_2$ may be connected together via A to form a ring; and X represents an acid anion, and said coupler is a compound having at least 20 carbon atoms in total, represented by formula (II):

(II)

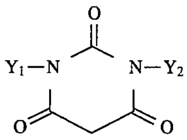

wherein $Y_1$ and $Y_2$, which may be the same or different, each represents a hydrogen atom, a substituted or unsubstituted alkyl group, a substituted or unsubstituted aralkyl group, or a substituted or unsubstituted aryl group.

2. A diazo heat-sensitive recording material as claimed in claim 1, wherein $R_1$ in formula (I) represents $—C(Z_1)(Z_2)—CH_2—O—Z_3$, $—CH_2—C(Z_1)(Z_2)—O—Z_3$ or $—\{C(Z_1)(Z_2)\}_m—O—Z_3$, wherein $Z_3$ represents a hydrogen atom, a substituted or unsubstituted alkyl group, a substituted or unsubstituted aralkyl group, or a substituted or unsubstituted aryl group.

3. A diazo heat-sensitive recording material as claimed in claim 1, wherein said coupler is a compound represented by formula (III):

(III)

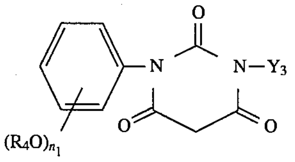

wherein $Y_3$ represents a hydrogen atom, a substituted or unsubstituted alkyl group, a substituted or unsubstituted aralkyl group or a substituted or unsubstituted aryl group; $R_4$ represents a substituted or unsubstituted alkyl group, a substituted or unsubstituted aralkyl group or a substituted or unsubstituted aryl group; and $n_1$ represents an integer of 1 to 5.

4. A diazo heat-sensitive recording material as claimed in claim 1, wherein said coupler is a compound represented by formula (IV):

(IV)

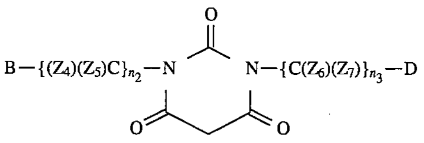

wherein $Z_4$, $Z_5$, $Z_6$, and $Z_7$ each represents a hydrogen atom, a substituted or unsubstituted alkyl group, substituted or unsubstituted aralkyl group or a substituted or unsubstituted aryl group; B and D each represents a cyano group, an alkoxycarbonyl group, an alkylsulfonyl group, an arylsulfonyl group or a carbamoyl group; and $n_2$ and $n_3$ each represents an integer of 1 to 4.

5. A diazo heat-sensitive recording material as claimed in claim 3, wherein $Y_3$ in formula (III) represents $—Ar—(OR_5)_{n4}$ or $—\{C(Z_8)(Z_9)\}_{n5}—E$, wherein Ar represents a substituted or unsubstituted aryl group; $R_5$ has the same meaning as $R_4$; $n_4$ represents an integer of 1 to 5; $Z_8$ and $Z_9$ each represents a hydrogen atom, a substituted or unsubstituted alkyl group, a substituted or unsubstituted aralkyl group or a substituted or unsubstituted aryl group; E represents a cyano group, an alkoxycarbonyl group, an alkylsulfonyl group, an arylsulfonyl group or a carbamoyl group; and $n_5$ represents an integer of 1 to 4.

6. A diazo heat-sensitive recording material as claimed in claim 1, wherein said diazo compound is microencapsulated.

* * * * *